United States Patent
Chiu

(10) Patent No.: US 8,300,492 B2
(45) Date of Patent: Oct. 30, 2012

(54) MEMORY

(75) Inventor: Chun-Yu Chiu, Tainan County (TW)

(73) Assignee: Himax Technologies Limited, Tainan (TW)

( * ) Notice: Subject to any disclaimer, the term of this patent is extended or adjusted under 35 U.S.C. 154(b) by 257 days.

(21) Appl. No.: 12/897,078

(22) Filed: Oct. 4, 2010

(65) Prior Publication Data

US 2012/0081980 A1  Apr. 5, 2012

(51) Int. Cl.
*G11C 8/00* (2006.01)

(52) U.S. Cl. ......... 365/230.06; 365/189.07; 365/189.09; 365/202

(58) Field of Classification Search ............. 365/189.07, 365/189.09, 20, 230.062
See application file for complete search history.

(56) References Cited

U.S. PATENT DOCUMENTS

| 7,817,486 B2 * | 10/2010 | Koike | 365/203 |
| 2005/0117413 A1 * | 6/2005 | Kang | 365/194 |
| 2011/0110174 A1 * | 5/2011 | Cho et al. | 365/194 |

* cited by examiner

*Primary Examiner* — Hoai V Ho
(74) *Attorney, Agent, or Firm* — J.C. Patents

(57) ABSTRACT

A memory including a memory cell array, a word line decoder, a first and a second reference bit line generators are provided. The memory cell array has first and last bit lines respectively disposed at two sides of the memory cell array. The word line decoder generates a pre-word line signal. The first and the second reference bit line generators respectively detect voltage level variations of the first and last bit lines according to the pre-word line signal, so as to generate a first and a second cut-back signals. The first reference bit line generator transmits the first cut-back signal to the second reference bit line generator, the second reference bit line generator transmits the first and the second cut-back signals to the word line decoder, and the word line decoder generates a word line signal according to the first and the second cut-back signals and the pre-word line signal.

7 Claims, 3 Drawing Sheets

320

MEMORY

BACKGROUND

1. Field of the Invention

The invention relates to a memory. Particularly, the invention relates to a memory capable of automatically adjusting write timing.

2. Description of Related Art

FIG. 1 is a schematic diagram of a memory cell of a conventional static random access memory (SRAM). FIG. 2 is a timing diagram of a word line signal, a bit line signal and a complementary bit line signal of FIG. 1. Referring to FIG. 1, when a word line signal WL of a memory cell 100 has a low voltage level (or a high voltage level; i.e. before the SRAM is operated), a bit line signal BL and a complementary bit line signal BLB are pre-charged to a high voltage level. Then, when the word line signal WL has a high voltage level (or a low voltage level; i.e. the SRAM is operated), metal oxide semiconductor (MOS) transistors M1 and M2 are turned on (i.e. a data in the SRAM has a high level when the bit line signal BL has a high voltage level and the complementary bit line signal BLB has a low voltage level or a data in the SRAM has a low level when the bit line signal BL has a low voltage level and the complementary bit line signal BLB has a high voltage level), and since the bit line signal BL and the complementary bit line signal BLB are complementary, the bit line signal BL is maintained to the high voltage level, and the complementary bit line signal BLB is pulled down from the high voltage level to the low voltage level, so as to achieve a full swing.

Since a sense amplifier in the SRAM can perform sensing when the voltage level of the complementary bit line signal BLB is pulled down by a magnitude greater than 200 mV, a mechanism of adjusting write timing is added to the SRAM, so as to achieve a power saving effect. FIG. 3 is a schematic diagram illustrating a conventional SRAM with reference bitline system to adjust write timing. Referring to FIG. 3, when the word line signal WL generated by a word line decoder 310 is transmitted to a reference bit line 320, the reference bit line 320 transmits back a cut-back signal REF_BL to cut off an excess part of the word line signal WL, so that the voltage level of the complementary bit line (not shown) in a memory cell array 320 is only pulled down by a magnitude just greater than 200 mV without being pulled down to the full swing. In this way, power consumption for again pre-charging the bit line/complementary bit line to the high voltage level is decreased, so as to achieve the power saving effect.

Due to a process shift or an uneven power line distribution of the SRAM 300, a pulling up speed of the bit line signal closed to the word line decoder 310 is relatively fast, and a pulling up speed of the bit line signal away from the word line decoder 310 is relatively slow. Therefore, a time for the reference bit line 320 generating the cut-back signal can be too short, so that the SRAM 300 may generate an error accessing operation.

SUMMARY OF THE INVENTION

The invention is directed to a memory, which can automatically detect and adjust an internal signal write timing, so as to avoid an error accessing operation, and accordingly improve a yield of the memory.

The invention provides a memory including a memory cell array, a word line decoder, a first reference bit line generator and a second reference bit line generator. The memory cell array has a plurality of first and last bit lines, wherein the first bit lines are disposed at a side of the memory cell array, and the last bit lines are disposed at another side of the memory cell array. The word line decoder is coupled to the memory cell array, and is used for generating a pre-word line signal and a word line signal. The first reference bit line generator is coupled to the first bit lines of the memory cell array, and is used for detecting a voltage level variation of the first bit lines according to the pre-word line signal, so as to generate a first cut-back signal. The second reference bit line generator is coupled to the last bit lines of the memory cell array, and is used for detecting a voltage level variation of the last bit lines according to the pre-word line signal, so as to generate a second cut-back signal. The first reference bit line generator transmits the first cut-back signal to the second reference bit line generator, the second reference bit line generator transmits back the first and the second cut-back signals to the word line decoder, and the word line decoder generates a word line signal according to the received first and second cut-back signals and the pre-word line signal.

In an embodiment of the invention, the first reference bit line generator is adjacent to the first bit lines of the memory cell array, and is located between the memory cell array and the word line decoder, and the second reference bit line generator is adjacent to the last bit lines of the memory cell array.

In an embodiment of the invention, this invention is better for the memory which its' lengths of two sides of the memory cell array that are respectively adjacent to the first reference bit line generator and the second reference bit line generator are shorter than lengths of two sides of the memory cell array that are not adjacent to the first reference bit line generator and the second reference bit line generator.

In an embodiment of the invention, the first reference bit line generator generates the first cut-back signal when detecting that the voltage level variation of the first bit lines reaches a predetermined level.

In an embodiment of the invention, the second reference bit line generator generates the second cut-back signal when detecting that the voltage level variation of the last bit lines reaches a predetermined level.

In an embodiment of the invention, the word line decoder further includes a calculation unit, a comparison unit and an adjusting unit. The calculation unit generates a first pulse signal according to a rising edge of the pre-word line signal to a rising edge of the first cut-back signal, and generates a second pulse signal according to the rising edge of the pre-word line signal to a rising edge of the second cut-back signal. The comparison unit is coupled to the calculation unit, and is used for receiving the first pulse signal and the second pulse signal, and comparing a length of the first pulse signal and a length of the second pulse signal to generate a difference value. The adjusting unit is coupled to the comparison unit, and is used for receiving the difference value and adjusting a first reference bit line cut back time in normal operation, so as to generate the word line signal.

In an embodiment of the embodiment, the adjusting unit converts the difference value into a digital value, so as to adjust the pre-word line signal according to a look-up table method.

According to the above descriptions, the first and the second reference bit line generators are disposed at two sides of the memory cell array, and the first and the second reference bit line generators are used to detect the voltage level variations of the bit lines of the memory cell array according to the pre-word line signal generated by the word line decoder, so as to generate the first cut-back signal and the second cut-back signal, and transmit back the first cut-back signal and the second cut-back signal to the word line decoder. Then, the word line decoder generates a suitable word line signal to the memory cell array according to the pre-word line signal, the first cut-back signal and the second cut-back signal. In this way, a problem that the memory of the invention generates an error accessing operation due to a process shift and uneven power line distribution can be avoided, so as to improve a yield of the memory.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
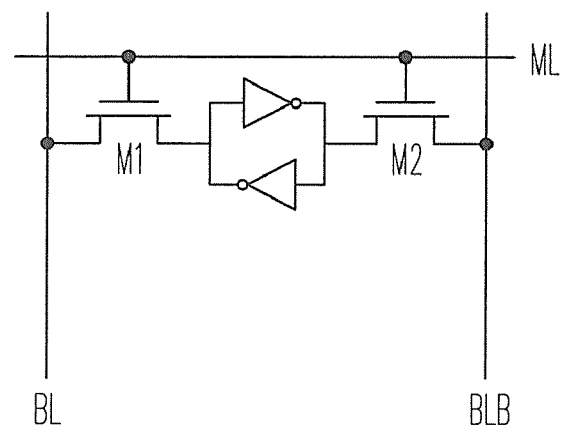
FIG. 1 is a schematic diagram of a memory cell of a conventional static random access memory (SRAM).
Figure 2:
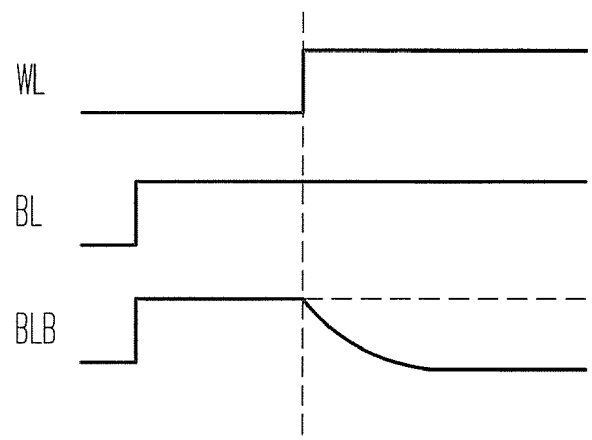
FIG. 2 is a timing diagram of a word line signal, a bit line signal and a complementary bit line signal of FIG. 1.
Figure 3:
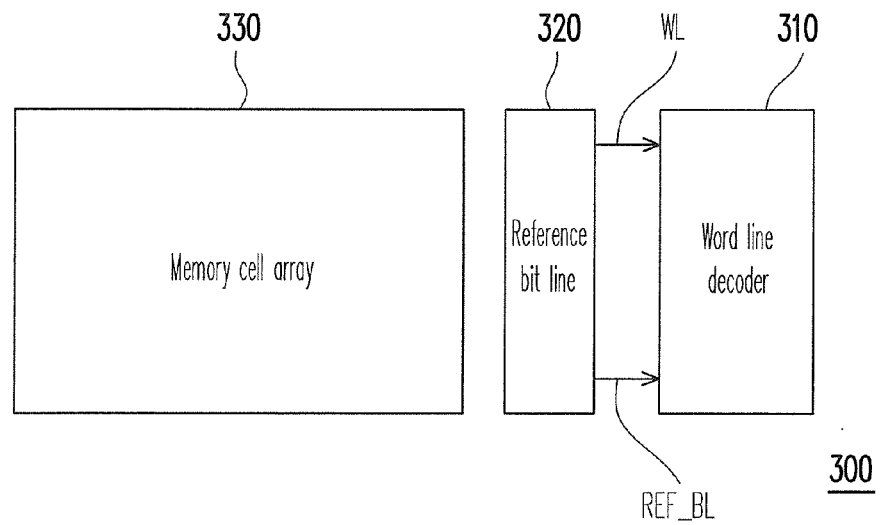
FIG. 3 is a schematic diagram illustrating a conventional SRAM with reference bit line.
Figure 4:
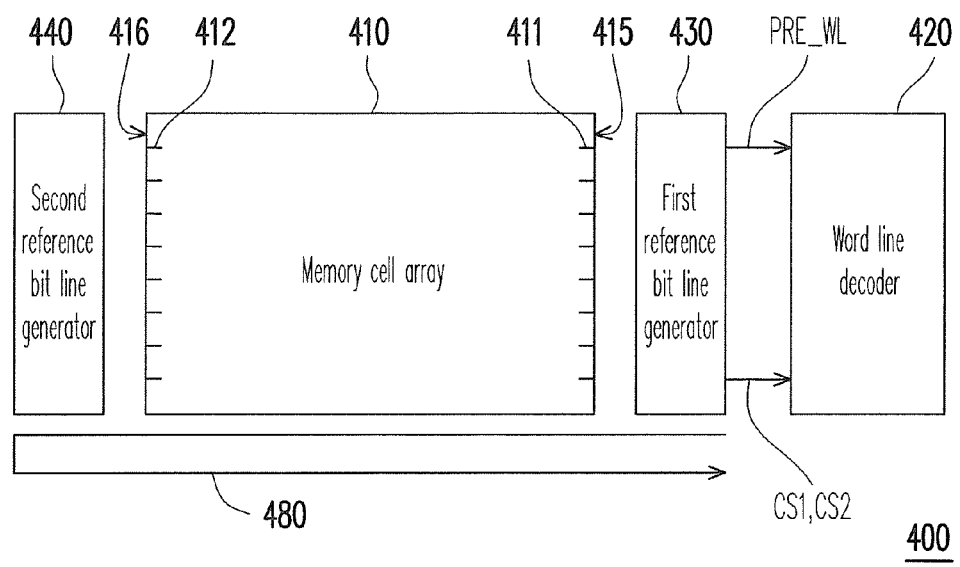
FIG. 4 is a schematic diagram of a memory according to an embodiment of the invention.

FIG. 4 is a schematic diagram of a memory according to an embodiment of the invention. Referring to FIG. 4, the memory 400 includes a memory cell array 410, a word line decoder 420, a first reference bit line generator 430 and a second reference bit line generator 440. In the present embodiment, the memory 400 can be a static random access memory (SRAM).

The memory cell array 410 has a plurality of first bit lines 411 and a plurality of last bit lines 412. The first bit lines 411 are disposed at a side 415 of the memory cell array 410, and the last bit lines 412 are disposed at another side 416 of the memory cell array 410. The word line decoder 420 is coupled to the memory cell array 410, and is used for generating a pre-word line signal PRE_WL and a world line signal when operation.

The first reference bit line generator 430 is coupled to the first bit lines 411 of the memory cell array 110, and detects a voltage level variation of the first bit lines 411 according to the pre-word line signal PRE_WL, so as to generate a first cut-back signal CS1. In the present embodiment, when the first reference bit line generator 430 detects that the voltage level variation of the first bit lines 411 reaches a predetermined level (for example, 200 mV), i.e. a voltage level of the first bit lines 411 is pulled down from a high voltage level by a magnitude of 200 mV, the first reference bit line generator 430 generates the first cut-back signal CS1.

The second reference bit line generator 440 is coupled to the last bit lines 412 of the memory cell array 410, and detects a voltage level variation of the last bit lines 412 according to the pre-word line signal PRE_WL, so as to generate a second cut-back signal CS2. In the present embodiment, when the second reference bit line generator 440 detects that the voltage level variation of the last bit lines 412 reaches the predetermined level (for example, 200 mV), i.e. a voltage level of the last bit lines 412 is pulled down from a high voltage level by a magnitude of 200 mV, the second reference bit line generator 440 generates the second cut-back signal CS2.

Then, the first reference bit line generator 430 transmits the first cut-back signal CS1 to the second reference bit line generator 440, and then the second reference bit line generator 440 transmits back the first cut-back signal CS1 and the second cut-back signal CS2 to the word line decoder 420. Namely, the first cut-back signal CS1 and the second cut-back signal CS2 are transmitted back to the word line decoder 420 through a same path 480. It means CS1 and CS2 suffer same wire delay. Then, the word line decoder 420 generates a word line signal WL according to the received first and second cut-back signals CS1 and CS2 and the pre-word line signal PRE_WL. In this way, the word line decoder 420 can generate the suitable word line signal WL, so that the memory 400 can be normally operated without being influenced by a process shift and an uneven power line distribution.

In the present embodiment, the first reference bit line generator 430 is adjacent to the first bit lines 411, and is located between the memory cell array 410 and the word line decoder 420, and the second reference bit line generator 440 is adjacent to the last bit lines 412.

Moreover, this method is better for memory with its' lengths of two sides of the memory cell array 410 that are respectively adjacent to the first reference bit line generator 430 and the second reference bit line generator 440 are shorter than lengths of two sides of the memory cell array 410 that are not adjacent to the first reference bit line generator 430 and the second reference bit line generator 440. Therefore, this method is better for the memory 410 is a rectangular memory.

Figure 5:
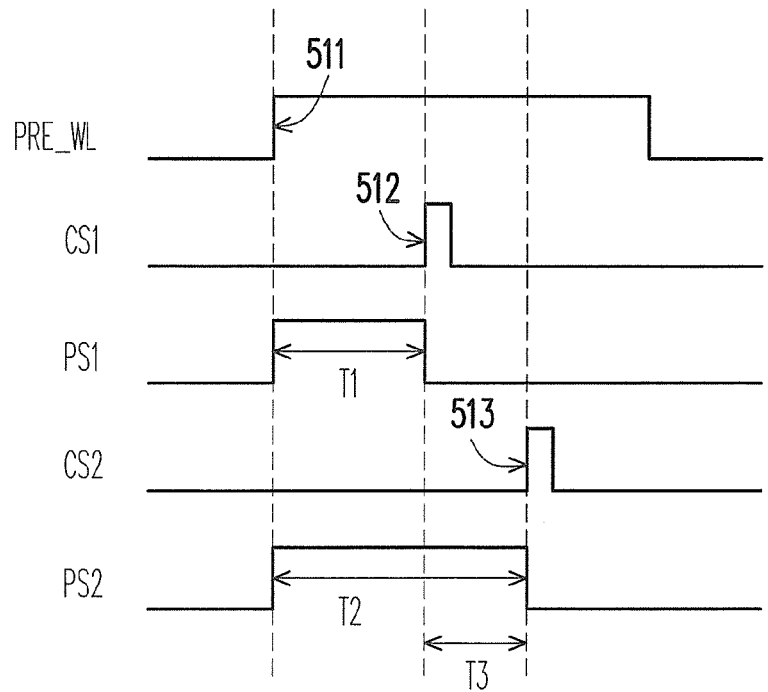
FIG. 5 is a timing diagram of a pre-word line signal, a first cut-back signal, a second cut-back signal, a first pulse signal and a second pulse signal according to an embodiment of the invention.
Figure 6:
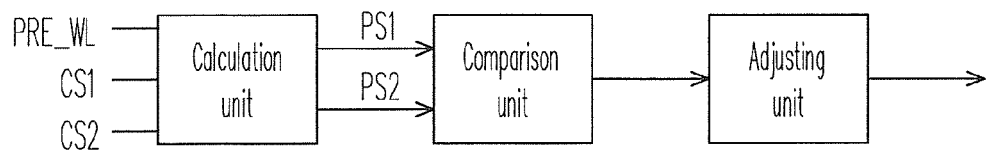
FIG. 6 is a detailed internal block diagram of a word line decoder.

To describe an operation of the memory 400 of the invention to those skilled in the art, an example is provided below for description. FIG. 5 is a timing diagram of the pre-word line signal, the first cut-back signal, the second cut-back signal, a first pulse signal and a second pulse signal according to an embodiment of the invention. FIG. 6 is a detailed internal block diagram of a word line decoder. Referring to FIG. 5 and FIG. 6, the word line decoder 320 further includes a calculation unit 610, a comparison unit 620 and an adjusting unit 630.

The calculation unit 610 generates a first pulse signal PS1 according to a rising edge (for example, "511" shown in FIG. 5) of the pre-word line signal PRE_WL to a rising edge (for example, "512" shown in FIG. 5) of the first cut-back signal CS1, and generates a second pulse signal PS2 according to the rising edge (for example, "511" shown in FIG. 5) of the pre-word line signal PRE_WL to a rising edge (for example, "513" shown in FIG. 5) of the second cut-back signal CS2.

The comparison unit 620 is coupled to the calculation unit 610, and is used for receiving the first pulse signal PS1 and the second pulse signal PS2, and comparing a length (for example, "T1" shown in FIG. 5) of the first pulse signal PS1 and a length (for example, "T2" shown in FIG. 5) of the second pulse signal PS2 to generate a difference value (for example, "T3" shown in FIG. 5). According to FIG. 5, it is obvious that the length T2 of the second pulse signal PS2 is greater than the length T1 of the first pulse signal PS1. Namely, a pulling up speed of the voltage level of the first bit lines 411 is greater than that of the last bit lines 412, and the difference value T3 is a time difference between a pulling up time of the first bit lines 411 and that of the last bit lines 412.

The adjusting unit 630 is coupled to the comparison unit 620, and receives the difference value T3 for adjusting a first reference bit line cut back time in normal operation, so as to generate a word line signal. In the present embodiment, the adjusting unit 630 estimates a length of the difference value T3 according to a predetermined length ΔT, so as to convert the difference value T3 into a digital value. For example, when the difference value T3 is smaller than the predetermined length ΔT, the difference value T3 is converted into a digital value of "000"; when the difference value T3 is between the predetermined length ΔT and twice of the predetermined length 2ΔT (i.e. ΔT<T3<2ΔT), the difference value T3 is converted into a digital value of "001"; when the difference value T3 is between twice of the predetermined length 2ΔT and triple of the predetermined length 3ΔT (i.e. 2ΔT<T3<3ΔT), the difference value T3 is converted into a digital value of "011"; when the difference value T3 is greater than triple of the predetermined length 3ΔT (i.e. 3ΔT<T3), the difference value T3 is converted into a digital value of "111".

Then, the adjusting unit 630 adjusts the first reference bit line cut back time in normal operation according to a look-up table method, so as to generate the word line signal. For example, when the digital value is "000", the adjusting unit 630 generates the first reference bit line cut back time in normal operation to serve as an enabling time of the word line signal. When the digital value is "001", the adjusting unit 630 adds the first reference bit line cut back time in normal operation by the predetermined length ΔT to serve as the enabling time of the word line signal. When the digital value is "011", the adjusting unit 630 adds the first reference bit line cut back time in normal operation by twice of the predetermined length 2ΔT to serve as the enabling time of the word line signal. When the digital value is "111", the adjusting unit 630 adds the first reference bit line cut back time in normal operation by triple of the predetermined length 3ΔT to serve as the enabling time of the word line signal. In this way, the suitable word line signal can be quickly and accurately obtained, so as to achieve a power saving effect of the memory 400, and avoid the error accessing operation of the memory 400 caused by the process shift and the uneven power line distribution.

In summary, the first and the second reference bit line generators are disposed at two sides of the memory cell array, and the first and the second reference bit line generators are used to detect the voltage level variations of the bit lines of the memory cell array according to the pre-word line signal generated by the word line decoder, so as to generate the first cut-back signal and the second cut-back signal, and transmit back the first cut-back signal and the second cut-back signal to the word line decoder. Then, the word line decoder generates a suitable word line signal to the memory cell array according to the pre-word line signal, the first cut-back signal and the second cut-back signal. In this way, the problem that the memory of the invention generates an error accessing operation due to the process shift and the uneven power line distribution can be avoided, so as to improve a yield of the memory.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A memory, comprising:
   a memory cell array, having a plurality of first and last bit lines, wherein the first bit lines are disposed at a side of the memory cell array, and the last bit lines are disposed at another side of the memory cell array;
   a word line decoder, coupled to the memory cell array, for generating a pre-word line signal and a word line signal;
   a first reference bit line generator, coupled to the first bit lines of the memory cell array, for detecting a voltage level variation of the first bit lines according to the pre-word line signal, so as to generate a first cut-back signal; and
   a second reference bit line generator, coupled to the last bit lines of the memory cell array, for detecting a voltage level variation of the last bit lines according to the pre-word line signal, so as to generate a second cut-back signal,
   wherein the first reference bit line generator transmits the first cut-back signal to the second reference bit line generator, the second reference bit line generator transmits back the first and the second cut-back signals to the word line decoder, and the word line decoder generates the word line signal according to the received first and second cut-back signals and the pre-word line signal.

2. The memory as claimed in claim 1, wherein the first reference bit line generator is adjacent to the first bit lines, and is located between the memory cell array and the word line decoder, and the second reference bit line generator is adjacent to the last bit lines.

3. The memory as claimed in claim 2, wherein lengths of two sides of the memory cell array that are respectively adjacent to the first reference bit line generator and the second reference bit line generator are shorter than lengths of two sides of the memory cell array that are not adjacent to the first reference bit line generator and the second reference bit line generator.

4. The memory as claimed in claim 1, wherein the first reference bit line generator generates the first cut-back signal when detecting that the voltage level variation of the first bit lines reaches a predetermined level.

5. The memory as claimed in claim 1, wherein the second reference bit line generator generates the second cut-back signal when detecting that the voltage level variation of the last bit lines reaches a predetermined level.

6. The memory as claimed in claim 1, wherein the word line decoder further comprises:
   a calculation unit, for generating a first pulse signal according to a rising edge of the pre-word line signal to a rising edge of the first cut-back signal, and generating a second pulse signal according to the rising edge of the pre-word line signal to a rising edge of the second cut-back signal;
   a comparison unit, coupled to the calculation unit, for receiving the first pulse signal and the second pulse signal, and comparing a length of the first pulse signal and a length of the second pulse signal to generate a difference value; and
   an adjusting unit, coupled to the comparison unit, for receiving the difference value and adjusting a first reference bit line cut back time in a normal operation, so as to generate the word line signal.

7. The memory as claimed in claim 6, wherein the adjusting unit converts the difference value into a digital value, so as to adjust the pre-word line signal according to a look-up table method.

* * * * *